(12) United States Patent
Albrecht et al.

(10) Patent No.: US 7,119,543 B2
(45) Date of Patent: Oct. 10, 2006

(54) GENERATOR DEVICE FOR GENERATING A MAGNETIC RESONANCE EXCITATION SIGNAL

(75) Inventors: Adam Albrecht, Nürnberg (DE); Horst Kröckel, Bamberg (DE); Wilfried Schnell, Forchheim (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 68 days.

(21) Appl. No.: 10/909,794

(22) Filed: Jul. 30, 2004

(65) Prior Publication Data
US 2005/0046476 A1    Mar. 3, 2005

(30) Foreign Application Priority Data
Jul. 31, 2003 (DE) .................. 103 35 127

(51) Int. Cl.
*G01V 3/00* (2006.01)
(52) U.S. Cl. ...................... 324/322; 324/318
(58) Field of Classification Search ............... 324/318, 324/322, 307; 330/150–152, 124; 333/218
See application file for complete search history.

(56) References Cited
U.S. PATENT DOCUMENTS

| | | | |
|---|---|---|---|
| 4,694,254 A | 9/1987 | Vatis et al. | |
| 5,140,268 A | 8/1992 | Chan | |
| 5,389,880 A * | 2/1995 | Mori | 324/318 |
| 5,793,253 A * | 8/1998 | Kumar et al. | 330/124 R |
| 6,304,085 B1 | 10/2001 | Kuth et al. | |
| 6,396,345 B1 * | 5/2002 | Dolman | 330/149 |
| 6,433,546 B1 | 8/2002 | Kroeckel et al. | |
| 6,646,504 B1 * | 11/2003 | Dittmer et al. | 330/124 R |
| 6,677,817 B1 * | 1/2004 | Posner | 330/52 |

* cited by examiner

*Primary Examiner*—Diego Gutierrez
*Assistant Examiner*—Megann E Vaughn
(74) *Attorney, Agent, or Firm*—Schiff Hardin LLP

(57) ABSTRACT

A generator device for a magnetic resonance excitation signal has a signal divider that divides an input signal supplied to it via an input element into at least two sub-signals and supplies them to amplification stages. The amplification stages amplify the respective sub-signals to produce amplified signals and supply the amplified signals to a signal combiner that combines them to form an aggregate signal, which is made externally available via an output element. Sensor devices that precede the signal divider and the signal combiner, acquire a reference signal that corresponds to the input signal and actual signals that correspond to the amplified signals and supply them to a control device. The control device acts on at least one of the amplification stages to cause the amplified signals to exhibit a predetermined amplitude ratio and a predetermined phase relation relative to one another.

15 Claims, 1 Drawing Sheet

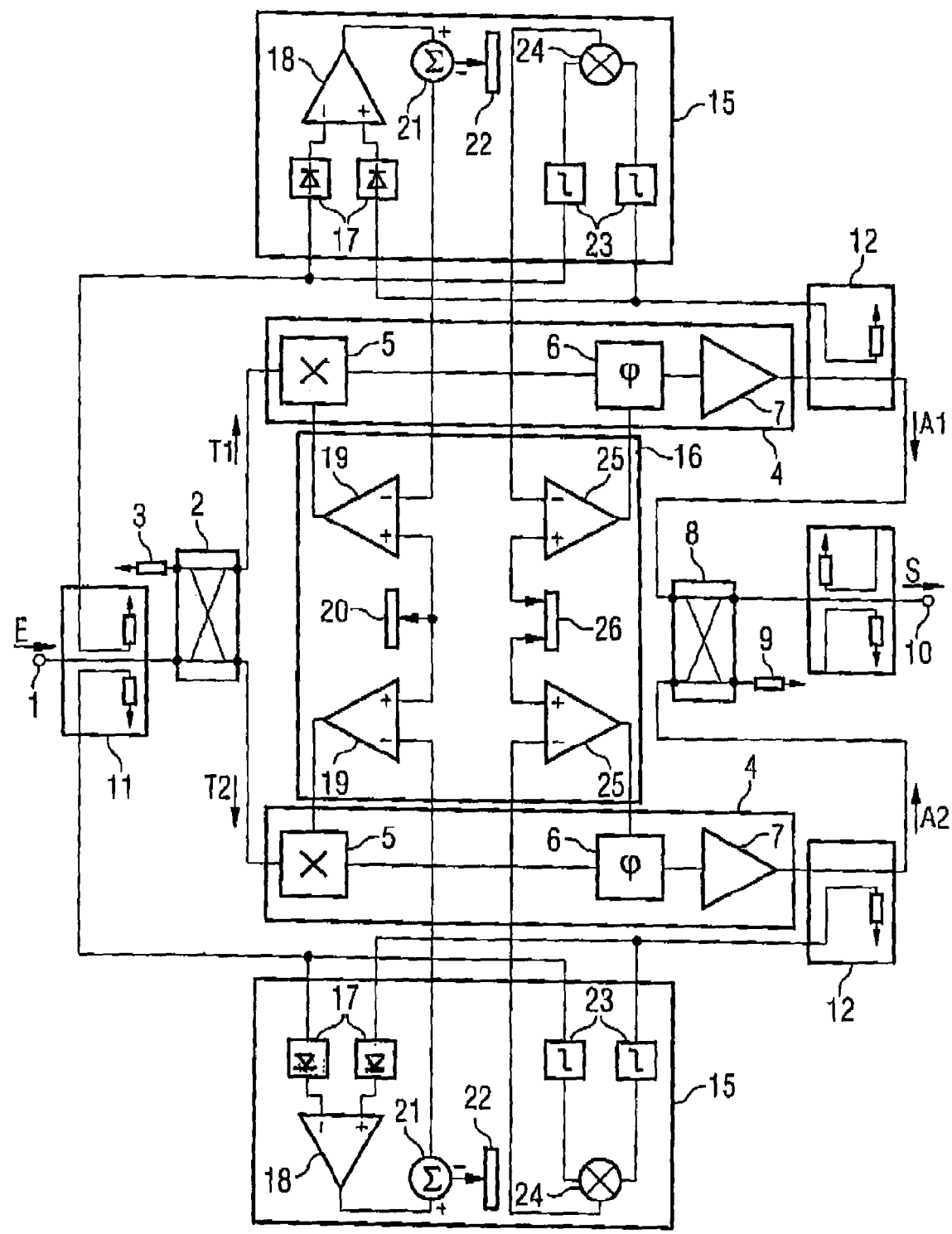

GENERATOR DEVICE FOR GENERATING A MAGNETIC RESONANCE EXCITATION SIGNAL

BACKGROUND OF THE INVENTION

1. Field of the Invention

The present invention is directed to a generation device for generating a magnetic resonance excitation signal, the device being of the type having an input element, an amplification stage and an output element, wherein an input signal is supplied to the amplification stage via the input element and wherein the amplification stage amplifies the input signal to produce an output signal that is made available via the output element.

2. Description of the Prior Art

German Patent 199 11 975 C2 or German Patent 100 04 423 C2 discloses generation devices of the above general type. The transmission arrangements described therein operate in a satisfactory manner but can only provide an output signal of limited amplitude.

SUMMARY OF THE INVENTION

An object of the present invention is to provide a generator device for a magnetic resonance excitation signal that can generate output signals with high amplitudes.

The object is achieved by a generator device for generating a magnetic resonance excitation signal wherein a signal divider follows an input element and divides an input signal supplied to it into at least two sub-signals, amplification stages follow the signal divider and amplify the sub-signals into respective output signals, a signal combiner follows the amplification stages and combines the output signals to an aggregate signal, an output element follows the signal combiner and the aggregate signal is made available via an output element. An input sensor device is connected between the input element and the signal divider and acquires at least one reference signal that corresponds to the input signal. Output sensor devices are connected respectively between the amplification stages and the signal combiner and acquire actual signals that correspond to the output signals. The input sensor device and the output sensor devices are connected to a control device and respectively supply the reference signal and the actual signals to the control device. The control device is connected to at least one of the amplification stages and influences the at least one of the amplification devices connected thereto such that the amplified signals exhibit a predetermined amplitude ratio and a predetermined phase relation relative to one another.

The inventive generator device thus allows the input signal to be separately amplified in a number of amplification stages that are connected in parallel with one another and additively superimposes the amplified signals.

The configuration setup of the generation device is simpler when the signal divider divides the input signal into sub-signals of the same amplitude.

The signal divider can be, for example, a 90° hybrid having two inputs with the second input being terminated with a terminating resistance such as a standard 50 ohm resistor. As a result, the signal divider is constructed in a cost-efficient and simple manner and still operates extremely effectively and with low loss.

It is particularly simple to combine the output signals when the amplitude signals exhibit equal amplitudes.

A pure additive superimposition of the amplitudes is achieved in an embodiment wherein the signal combiner combines the output signals in a phase-offset manner, and wherein the sub-signals exhibit a predetermined input phase relation to one another that is different from zero, and wherein the phase shift of the signal combiner and the phase relation of the output signals relative to one another compensate each other.

The signal combiner can be fashioned, for example, as a 90° hybrid having two outputs, with the second output being terminated with a terminating resistance such as a standard 50 ohm resistor. In this way, it is possible to combine the output signals in a lossless manner.

Each amplification stage normally includes a high-frequency power amplifier. An amplitude regulator and a phase regulator precede the high-frequency power amplifier at least in the amplification stage that is connected to the control device. As a result, it is particularly simple to influence the amplitude and phase.

In an embodiment wherein the sensor devices are fashioned as directional couplers, they are insensitive to reflected signals, as can occur in particular given rapid amplitude changes or given inaccurately adapted load impedances.

The control device operates in a particularly reliable manner in an embodiment wherein the control device, for each amplification stage determines an amplitude intermediate signal and a phase intermediate signal on the basis of the reference signal and the corresponding actual signal and acts on the (at least one) amplification stage that is connected to the control device on the basis of the intermediate signals. In this embodiment, the individual amplifications and phase shifts can be determined independently of one another.

In an embodiment wherein the control device, for each amplification stage, determines an amplitude control variable on the basis of the amplitude intermediate signal and on the basis of a reference amplitude signal that can be prescribed commonly for all amplification stages, and outputs this amplitude control variable to the respective amplification stage, it is assured in a simple manner that the individual output signals have the same amplitudes.

In a further embodiment the control device has a correcting element for each amplitude intermediate signal, with which the amplitude intermediate signal is corrected by an individually prescribable correcting value. This allows individual correction in each branch of the generator device.

In another embodiment the control device determines a phase variable for each amplification stage on the basis of the phase intermediate signal and a reference phase signal that can be prescribed for each amplification stage and outputs this phase control variable to the respective amplification stage. This allows the phase of the respective amplified signals, relative to the input signal, to be adjusted in a particularly simple manner. Preferably, the reference phase signals are individually prescribed for each amplification device.

In an embodiment wherein the input sensor device acquires a separate reference signal for each amplification stage, the individual amplification branches of the generation device are decoupled even further from one another.

When the generation device is fully symmetrically constructed, a simpler circuit design of the generation device is achieved.

DESCRIPTION OF THE DRAWINGS

The single FIGURE is a circuit schematic for a generator device for a magnetic resonance excitation signal in accordance with the invention.

DESCRIPTION OF THE PREFERRED EMBODIMENTS

As shown in the FIGURE, a generator device for a magnetic resonance excitation signal has an input element 1. A high-frequency input signal E is supplied to the generation device via the input element 1. The high-frequency input signal E typically has a frequency between 8 and 150 MHz. It is supplied from the input element 1 to a signal divider 2 that follows the input element 1.

The signal divider 2 is fashioned as a conventional 90° hybrid having two inputs and two outputs. One input is connected to the input element 1 and the other input is terminated via a terminating resistance 3, typically a 50 ohm resistor. Therefore, the signal divider 2 divides the input signal into two sub-signals T1, T2. The sub-signals T1, T2 exhibit the same amplitudes as a result of the construction of the signal divider 2, but their phases are offset 90° relative to one another.

The sub-signals T1, T2 are supplied to amplification stages 4 that follow the signal divider 2. Each amplification stage 4 has an amplitude regulator 5, a phase regulator 6 and a high-frequency power amplifier 7, with the high-frequency power amplifier 7 being the last component of this chain. Therefore, the amplitude regulators 5 and the phase regulators 6 precede the high-frequency power amplifiers 7. The sequence of the amplitude regulator 5 and the phase regulator 6 is arbitrary.

On the basis of the amplitude regulator 5 and the phase regulator 6, the sub-signals T1, T2 are modified such that the amplification devices 4, respectively amplify the sub-signals T1, T2 to produce amplified signals A1, A2, which have a predetermined amplitude ratio and a predetermined phase relation relative to one another. Explanations in greater detail follow below. Normally, the output signals A1, A2 have the same amplitudes (i.e., the ratio is 1:1).

The amplified signals A1, A2 are supplied to a signal combiner 8 that follows the amplification devices 4. The signal combiner 8 combines the amplified signals A1, A2 to an aggregate signal S.

In the same way as the signal divider 2, the signal combiner 8 is configured as a conventional 90° hybrid having two inputs and two outputs. The aggregate signal S is emitted at the one output and the other output is terminated with a terminating resistance 9, typically a 50 ohm resistor.

As a result of the construction of the signal combiner 8, it combines the amplified signals A1, A2 in a phase-offset manner—namely phase-offset by 90°. Therefore, the phase offset of the amplified signals A1, A2 should be 90° so that the phase offset of the signal combiner 8 and the phase relation of the amplified signals A1, A2 relative to one another compensate each other. In this way, the signals can be combined in a purely additive, lossless manner.

The aggregate signal S is supplied from the signal combiner 8 to an output element 10 that follows the signal divider 8. The aggregate signal S is made externally available as an output signal via the output element 10 and can be supplied to a magnetic resonance transmission antenna, for example.

An input sensor device 11 and output sensor devices 12 are provided to achieve correct adjustment of the amplitudes and the phases of the amplified signals A1, A2. The input sensor device 11 is connected between the input element 1 and the signal divider 2. The output sensor devices 12 are respectively connected between the amplification stages 4 and the signal combiner 8. As shown in the FIGURE, the sensor devices 11, 12 are configured as directional couplers.

For each amplification stage 4, the input sensor device 11 acquires a reference signal corresponding to the input signal. The output sensor devices 12 respectively acquire actual signals respectively corresponding to the amplified signals A1, A2. The reference signal and the actual signals are supplied to a control device with which the sensor devices 11, 12 are connected.

As shown in the FIGURE, the control device is formed by two preprocessing units 15 and a common main unit 16. It is connected to at least one—both in the FIGURE—of the amplification stages 4 and acts upon the (at least one) amplification stages 4 such that the amplified signals A1, A2 exhibit the aforementioned predetermined amplitude ratio and predetermined phase relation relative to one another.

As shown in the FIGURE, the reference signal and the actual signal are supplied to logarithmic rectifiers 17 in each amplification stage 4. On the basis of the rectifiers 17, signals of low frequency are produced from the input signal E and one of the amplified signals A1, A2. An amplitude intermediate signal is produced for the respective amplification stage 4 by forming a difference in a subtractor 18.

The amplitude intermediate signals are supplied as actual values to amplitude controllers 19 which are also allocated to the respective amplification stage 4. As a reference value, a reference amplitude signal is prescribed for the amplitude controllers 19. The reference amplitude signal is the same for all amplification stages 4. It can be prescribed to the amplitude controllers 19 via a potentiometer 20, for example.

The amplitude controllers 19 preferably are I-controllers or at least exhibit an integrating function. From the difference between the reference value and the actual value, they each determine an amplitude control variable for the respective amplification stage 4 and supply this amplitude control variable to the amplitude regulator 5 of the respective amplification stage 4. It is thus assured that the amplitudes of the output signals A1, A2 exhibit the same magnitudes or, in a more general sense, exhibit a predetermined amplitude ratio.

As also shown in the FIGURE, correcting elements 21 are arranged between the subtractors 18 and the amplitude controllers 19. In the correcting elements 21, the amplitude intermediate signals are corrected by correcting values. The correcting values can be individually prescribed for each amplitude intermediate signal. This can occur again via potentiometers 22, for example. On the basis of the correcting values, an offset, for example, with respect to the sensitivity of the individual sensor branches and detector branches can be tuned.

Furthermore, the reference values and the actual values—separately for each amplification stage 4—are supplied to limiters 23, the output signals of which are supplied to phase detectors 24. On the basis of these signals, the phase detectors 24 determine a phase intermediate signal for each amplification stage 4 and supply the phase intermediate signals as actual values to respective phase controllers 25. Each phase controller 25 is allocated to only one of the amplification stages 4.

As reference values, reference phase signals are also supplied to the phase controllers 25. These reference phase signals preferably are individually prescribed for the respective phase controller 25. This can occur again via a potentiometer 26. This potentiometer 26, however, must have a separate tap for each phase to be adjusted.

On the basis of the phase intermediate signals and the reference phase signals, each phase controller 25 determines a phase control variable for the phase regulator 6 of the respective amplification stage 4. This control variable is subsequently emitted to the respective phase regulator 6 so that the phase of each of the amplified signals A1, A2 is also correctly adjusted, for example to −90°. The phase controllers 25 preferably are configured as I-controllers or at least exhibit an integrating function.

As can be seen from the FIGURE, the inventive generation device is fully-symmetrically constructed. Therefore, it can be realized in a simple and cost-effective manner. Furthermore, the individual amplification branches are completely decoupled from one another. Therefore, further measures are possible in each amplification branch such as arrangement of compressors in front of the high-frequency power amplifiers 7 or opening of the control loops given input signals E that are too low. Further details of these measures are described in a co-pending application Ser. No. 10/903,643 entitled "Transmission Arrangement for a Magnetic Resonance Apparatus" of the same inventors and assignee, filed simultaneously herewith.

Although modifications and changes may be suggested by those skilled in the art, it is the intention of the inventors to embody within the patent warranted hereon all changes and modifications as reasonably and properly come within the scope of their contribution to the art.

We claim as our invention:

1. A generator device for generating a magnetic resonance excitation signal, comprising:
    an input element adapted to receive an input signal;
    a signal divider following said input element for dividing said input signal into at least two sub-signals;
    at least two amplification stages connected in parallel following said signal divider for respectively amplifying said sub-signals to produce respective amplified signals;
    a signal combiner connected following said amplification stages for combining said amplified signals to form an aggregate signal;
    an output element connected following said signal combiner for making said aggregate signal externally available as an output signal;
    an input sensor device connected between said input element and said signal divider for acquiring at least one reference signal corresponding to said input signal;
    at least two output sensor devices respectively connected between said amplification stages and said signal combiner for respectively acquiring actual signals respectively corresponding to said amplified signals; and
    a control device connected to said input sensor device, said output sensor devices, and at least one of said amplification stages, for controlling said at least one of said amplification stages dependent on the reference signal and the actual signals from the output sensor devices, for causing said amplified signals to exhibit a predetermined amplitude ratio and a predetermined phase relation relative to each other.

2. A generator device as claimed in claim 1 wherein said signal divider divides said input signal into sub-signals having the same amplitude.

3. A generator device as claimed in claim 1 wherein said signal divider is a 90° hybrid having two inputs, a first of said inputs being supplied with said input signal and a second of said inputs being terminated with a terminating resistance.

4. A generator device as claimed in claim 1 wherein said control device controls said at least one amplification stage for causing said amplified signals to exhibit an amplitude ratio of 1:1.

5. A generator device as claimed in claim 1 wherein said sub-signals have a predetermined phase relation relative to each other that is different from zero, and wherein said amplified signals thus have a phase relation relative to each other, and wherein said signal combiner combines said amplified signals with a phase offset that compensates for said phase relation between said amplified signals.

6. A generator device as claimed in claim 1 wherein said signal combiner is a 90° hybrid having two outputs, with said aggregate signal being emitted at a first of said outputs and with a second of said outputs being terminated with a terminating resistance.

7. A generator device as claimed in claim 1 wherein each of said amplification stages contains a high-frequency power amplifier.

8. A generator device as claimed in claim 7 comprising, in said at least one of said amplification stages connected to said control device, an amplitude regulator and a phase regulator both preceding said high-frequency power amplifier.

9. A generator device as claimed in claim 1 wherein each of said input sensor device and said output sensor devices is a directional coupler.

10. A generator device as claimed in claim 1 wherein said control device, from said reference signal and from the actual signal, determines, for each amplification stage, an amplitude intermediate signal and a phase intermediate signal, for modifying operation of one of said amplification stages for producing said predetermined amplitude ratio and said predetermined phase relation of said amplified signals relative to each other.

11. A generator device as claimed in claim 10 wherein said control device comprises a source for a reference amplitude signal common to all of said amplification stages, and wherein said control device, from said amplitude intermediate signals and said reference amplitude signal, generates an amplitude control variables and supplies said amplitude control variables to the respective one of said amplification stages for setting operation of amplification stages for producing said predetermined amplitude ratio of said amplified signals relative to each other.

12. A generator device as claimed in claim 10 wherein said control device for each amplitude intermediate signal comprises a respective correcting element for correcting said amplitude intermediate signals to compensate for a correction value individually for the respective amplifier stage.

13. A generator device as claimed in claim 10 wherein said control device comprises a source for generating for each of said amplification stages a reference phase signal, and wherein said control device, from said phase intermediate signals and said reference phase signals, generates a phase control variable and supplies said phase control variable to the respective one of said amplification stages for modifying operation of said amplification stages for producing said predetermined phase relation of said amplified signals relative to each other.

14. A generator device as claimed in claim 13 wherein said reference phase signals are settable individually for each of said amplification stages.

15. A generator device as claimed in claim 1 wherein said control device is connected to each of said amplification stages for controlling both of said amplification stages for causing said amplified signals to have said predetermined amplitude ratio and said predetermined phase relation relative to each other, and wherein said input element, said control device, said amplification stages, said output element, said input sensor device and said sensor devices are, in combination, completely symmetrical.

* * * * *